United States Patent [19]

Fok et al.

[11] Patent Number: 4,684,921
[45] Date of Patent: Aug. 4, 1987

[54] RLL (1,7) ENCODER WITH SINGLE STATE BIT

[75] Inventors: Wilson W. Fok, San Jose; John P. Moussouris, Palo Alto, both of Calif.

[73] Assignee: International Business Machines Corporation, Armonk, N.Y.

[21] Appl. No.: 878,513

[22] Filed: Jun. 23, 1986

Related U.S. Application Data

[63] Continuation of Ser. No. 745,255, Jun. 13, 1985, abandoned.

[51] Int. Cl.$^4$ ............................................ H03M 7/00
[52] U.S. Cl. ................................ 340/347 DD; 360/40
[58] Field of Search .................... 340/347 DD; 360/40

[56] References Cited

U.S. PATENT DOCUMENTS

| | | | |
|---|---|---|---|
| 3,685,033 | 8/1972 | Srivastava et al. | 340/174.1 |
| 4,115,768 | 9/1978 | Eggenberger et al. | 340/347 |
| 4,337,458 | 6/1982 | Cohn | 340/347 DD |
| 4,413,251 | 11/1983 | Adler et al. | 340/347 |
| 4,488,142 | 12/1984 | Franaszek | 340/347 DD |

OTHER PUBLICATIONS

Erickson, "IBM Technical Disclosure Bulletin", vol. 21, No. 2, Jul. 1978, pp. 807–808.
Co-Pending, Related Patent Application Serial No. 745,242, filed Jun. 13, 1985.

Primary Examiner—Charles D. Miller
Attorney, Agent, or Firm—Brown, Martin, Haller & Meador

[57] ABSTRACT

An apparatus for producing, from four consecutive unconstrained data bits in a bit string, a run-length-limited (RLL) encoded symbol consisting of three coded data bits. The internal state of the encoder is described by one state bit. The encoder performs RLL (1,7) encoding on a bit-by-bit basis, and can be cascaded in parallel to perform encoding on sequential, equally-sized groups of unencoded data bits. An attractive feature of the encoder is that it can be cascaded to simultaneously encode consecutive bytes of data.

5 Claims, 9 Drawing Figures

RLL (1,7) ENCODER WITH SINGLE STATE BIT

This is a continuation of application Ser. No. 745,255 filed June 13, 1985, now abandoned.

BACKGROUND OF THE INVENTION

This invention relates to apparatus for encoding sequences of unconstrained data into sequences of encoded data obeying RLL (1,7) encoding rules.

As is known, conventional computer systems utilize magnetic disks for data storage. In order to maximize the amount of data stored on a disk, many such systems normally employ some form of run-length-limited (RLL) coding to encode data prior to entry onto a disk, which provides particularly dense packing of disk-stored data.

In the family of RLL codes, the (1,7) format is gaining increasing acceptance in the industry as the preferred RLL coding format for present magnetic disk technology. In employing the RLL (1,7) coding format, a sequence of unencoded binary data is converted into an encoded bit string in which each one in a coded bit sequence must be separated from the nearest adjacent one by at least one, but no more than seven zeros. In this format, the most efficient coding rate results when every two unencoded data bits are converted into three coded bits. Conversely, in the decoding process, three coded data bits are converted into two decoded data bits. This technique is taught in detail in U.S. Pat. No. 4,413,251 to R. L. Adler et al, which is assigned to the assignee of this patent application.

A typical prior art architecture employing RLL (1,7) coding in a magnetic disk storage system is illustrated in FIG. 1. As is typical, unencoded data from a data processing system is provided to the encoder section of an encoder/decoder (ENC/DEC) through a serializer/deserializer (S/D). When provided to the serializer/deserializer, the data is normally in parallel byte form, which must be serialized into a sequence of 2-bit groups. Each 2-bit group provided to the encoder results in the provision of three encoded bits that go to a buffer (B) for serialization into an encoded, bit-wide data string that is processed by drive circuitry for writing onto a magnetic disk. In the industry, this is referred to as bit-by-bit encoding. When data is read from the disk, a bit-wide encoded data string is provided through the buffer B in the form of successive groups of three encoded bits to the decoder section of the encoder/decoder. Each successive group of three encoded bits is decoded to a group of two data bits (bit-by-bit decoding). The succession of bit pairs from the decoder are converted by the serializer/deserializer into a succession of bytes that are forwarded to the data processing system.

An artifact of the bit-by-bit coding system of FIG. 1 is the requirement for at least two conversion clocks: an $f_C$ clock for the encoded bit channel and a $\frac{2}{3} f_C$ clock for the transfer of data between the serializer/deserializer S/D and the buffer B.

The $f_C$ clock can be derived conventionally from a disk servo clock while writing information to a disk or from encoded read data obtained from a disk while reading information from the disk. Normally, $f_C$ is obtained under either circumstance through a voltage-frequency oscillator (VFO).

The $\frac{2}{3} f_C$ clock is usually derived by use of a second VFO synchronized to the $f_C$ clock. This imposes an added hardware requirement and requires the settling times of two VFO's to be accounted for when the timing source to the $f_C$ VFO is switched.

Moreover, the FIG. 1 architecture requires an extra format conversion for unencoded and decoded data passing between the serializer/deserializer and encoder/decoder, further adding complexity to the system.

Further, the typical prior art RLL (1,7) encoder consists of a finite-state machine whose internal state is described by three state bits. Plural state bits increase the logic and storage hardware requirements of the encoder, which make it awkward for being cascaded in parallel to provide byte-wide encoding.

SUMMARY OF THE INVENTION

The technical problem that is solved by the encoder of the invention is the elimination of the need to generate and store an excess of state signals to define the internal state of an RLL (1,7) encoder that encodes two unconstrained data bits at a time in an unconstrained bit string into three constrained encoded bits at a coding rate of $\frac{2}{3}$. The problem solution permits a greatly simplified hardware implementation to perform the required encoding. The simplified encoder requires only a single state bit to define its current internal state, thus improving on the prior art RLL (1,7) encoder that requires three state bits.

In particular, the encoder of the invention is responsive to a data string including an unconstrained sequence of at least four unencoded bits for producing a corresponding string of run-length-limited (RLL) (1,7) symbols. The encoder includes a bank of storage devices that receive two unencoded bits ($x_2$, $x_3$) from said data string and store the two bits ($x_0$, $x_1$) immediately preceding the two received bits, and a single storage device for receiving a single state bit (w) derived from encoding the two stored bits ($x_0$, $x_1$) prior to encoding the two received bits ($x_2$, $x_3$). The encoder further includes logic circuitry that responds to the received and stored bits ($x_0$, $x_1$, $x_2$, $x_3$) and to the state bit (w) by producing an RLL (1,7) encoded symbol (Y) and a next state bit (w') that is used to encode the pair of unconstrained bits in the data string that immediately succeed the received bits ($x_2$, $x_3$).

The primary objective of the invention is to provide an efficient RLL (1,7) encoder that utilizes four consecutive unencoded bits to implement a $\frac{2}{3}$ coding rate.

It is a further object of the invention to reduce the number of bits describing the internal state of the decoder to a single bit.

It is a still further object of the invention to provide an improved RLL (1,7) encoder operating at a $\frac{2}{3}$ coding rate.

Other objectives and attendant advantages of the invention will become more apparent when its detailed description is read in light of the below-described drawings.

DETAILED DESCRIPTION OF THE PREFERRED EMBODIMENT

In the description which follows, a byte of data is taken, as in the usual sense, to denote a sequence of eight adjacent binary digits (bits) that are operated upon as a unit. A parallel byte refers to the eight bits transferred simultaneously on a data channel including 8 parallel transmission paths. A string refers to a linear sequence of bits. A coded symbol consists of a group of three consecutive bits resulting from an encoding operation performed on two bits of unencoded data. A symbol string is a string of encoded bits in which successive groups of three bits form successive symbols.

In the magnetic disk storage art, weight is assigned a bit in a data string according to its place in the string. The first bit is accorded the most significance (MSB) and is assigned the lowest-numerical subscript, e.g., $x_0$. Bits occurring after the MSB have correspondingly less significance, but subscripts of higher magnitude. Thus, in a serial byte, bit $x_0$ (the first bit) is the MSB while bit $x_7$ (the last bit) is the LSB. In the following description, this significance convention is observed for unencoded bits (x), encoded bits (y), and symbols (Y).

Figure 1:
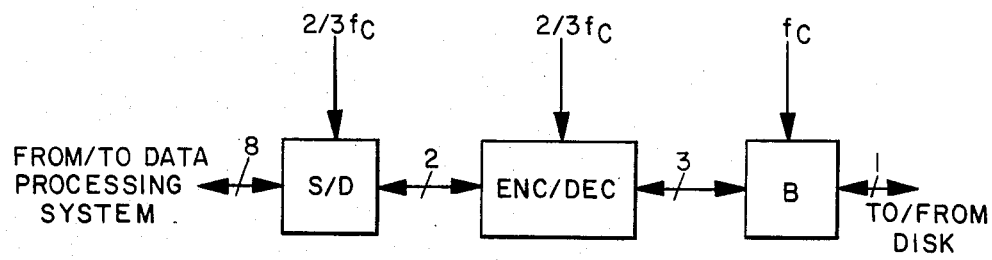
FIG. 1 is a block diagram of code conversion architecture in the prior art.
Figure 2:
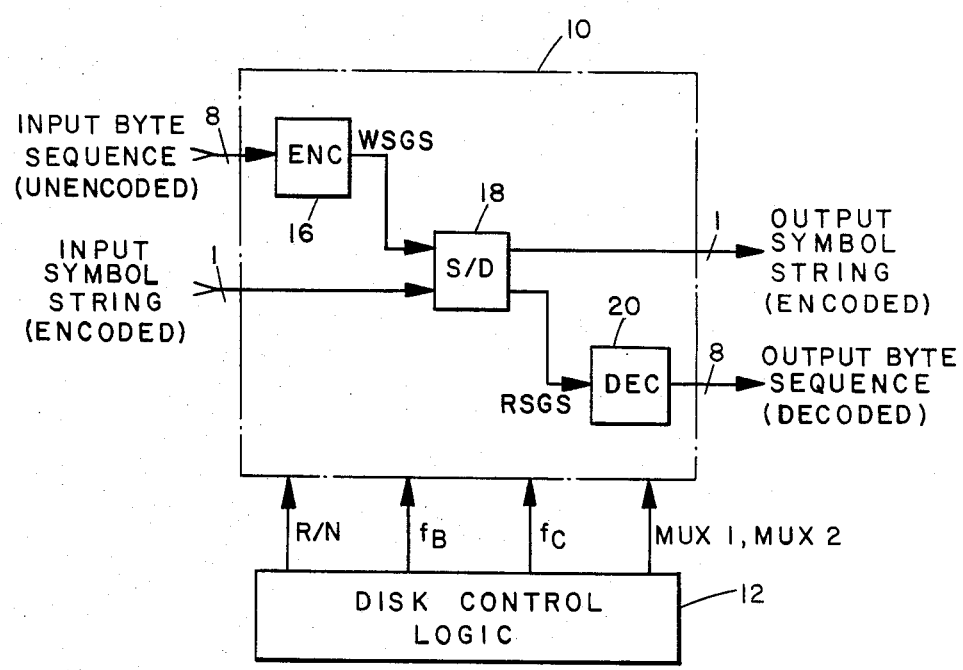
FIG. 2 is a block diagram illustrating the general architecture of the system of the invention.

As illustrated in FIG. 2, the system of the invention, enclosed in the dashed outline indicated by reference numeral 10, accepts an input byte sequence constituting a succession of parallel bytes on a data channel that is eight bits wide. Each byte consists of eight simultaneously-transferred bits. The byte sequence is fed to the system 10 for being encoded into an output consisting of a string of RLL (1,7)-encoded symbols.

An input byte sequence can be provided from a conventional data processing system (not shown) for being entered (written) onto a magnetic disk (also not shown) for storage and later retrieval. The input byte sequence is converted by the system of the invention to an output symbol string, in which form it is stored on the disk.

When data stored on the magnetic disk is to be retrieved (read), an input symbol string is obtained from the disk and provided to the system 10 for conversion into a decoded output byte sequence that is forwarded to the data processing system.

As is conventional, the system 10 operates in conjunction with conventional disk control logic 12 that provides a read/write (R/W) gate signal for defining the mode of operation for the system 10. In one state, the R/W signal denotes a disk read operation, and in another state, a disk write operation. The control logic includes a VFO (not shown) to generate a symbol channel clock $f_C$ and a multi-phase byte clock $f_B$ that is constrained to be an integer sub-multiple of $f_C$. The control logic 12 also provides conventional signals MUX 1 and MUX 2 for controlling conventional multiplexing and format conversion circuitry in the system 10.

The system 10 is a byte-wide encoder and decoder for RLL (1,7) code and includes an RLL encoder 16 that accepts consecutive bytes of an input byte sequence at a byte rate $f_B$ and encodes them according to RLL (1,7) coding rules into a write symbol group sequence (WSGS). The write symbol group sequence consists of a sequence of groups of parallel encoded symbol bits. The $\frac{2}{3}$ conversion rate constrains each group of the write symbol group sequence to twelve bits, which form 4 symbols.

The write symbol group sequence is provided to a serializer/deserializer circuit 18 that, during a write mode of operation, performs parallel-to-serial format conversion to convert the 12-bit wide write symbol group sequence into a bit-wide output symbol string having a string rate $f_C$ that is equal to 12 $f_B$.

The serializer/deserializer circuit 18, during a read mode of operation, receives a bit-wide input symbol string at the string rate $f_C$ and performs serial-to-parallel format conversion on the input string to produce a read symbol group sequence (RSGS) consisting of the succession of groups of twelve parallel encoded data bits. The read symbol group sequence is provided to an RLL decoder 20 which converts the sequence to a corresponding parallel byte sequence of decoded bits that is forwarded at the byte rate $f_B$ to the data processing system as read data.

In the operation, explained below, of the system 10 in converting between symbol strings and parallel byte sequences, only 2 clock signals, $f_C$ and $f_B$, are required. The byte clock $f_B$ is necessary to stage parallel bytes into and out of the system 10 and to move symbol groups between the encoder 16 and the format converter 18, and between the format converter 18 and the decoder 20. The symbol channel clock $f_C$ clocks coded data strings into and out of the system 10. Thus, the advantage of the system 10 is clearly illustrated in FIG. 2: the requirement for the odd $\frac{2}{3}$ clock to aid in encoding and decoding is eliminated.

Figure 3:
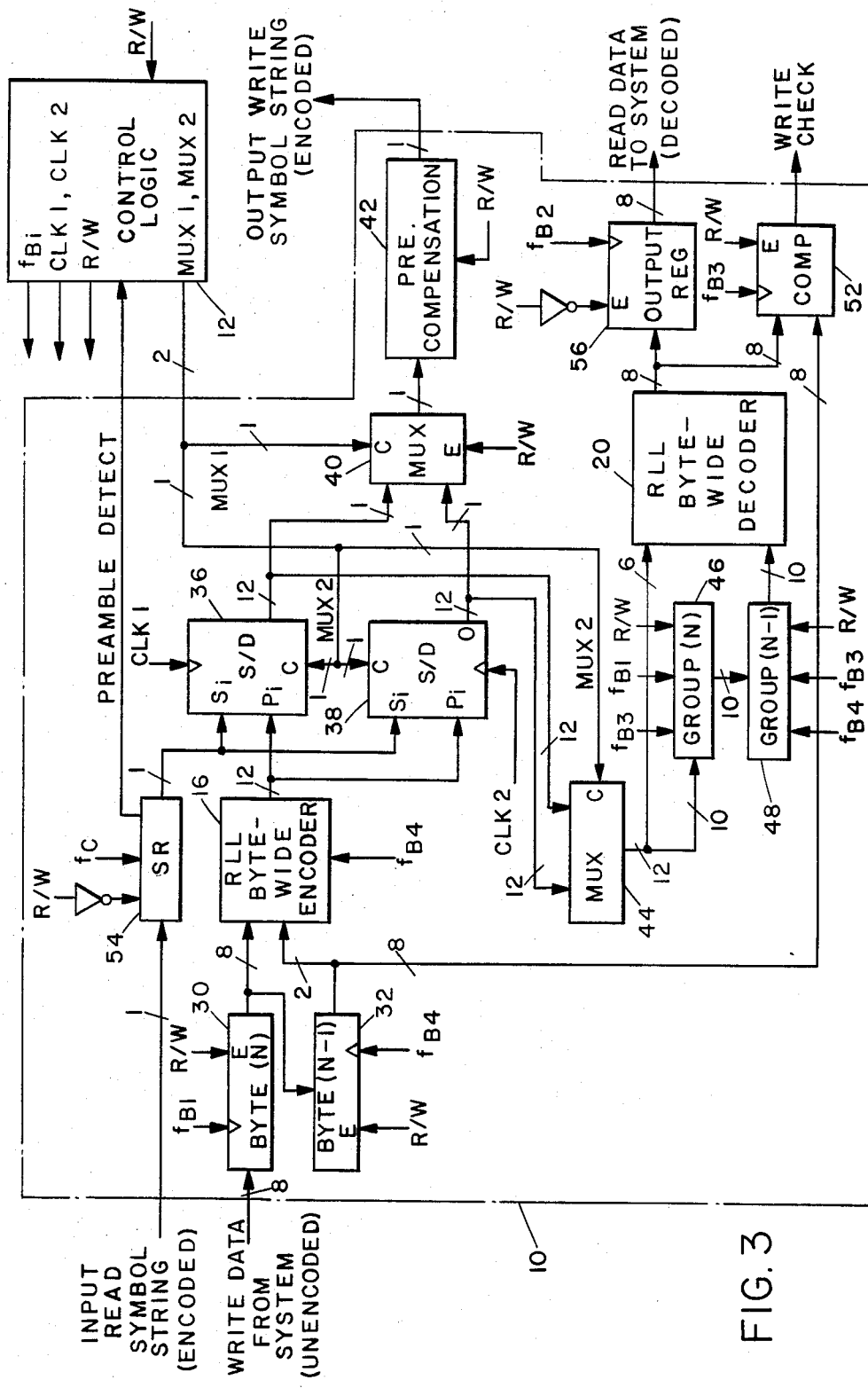
FIG. 3 is a more detailed illustration of the functional blocks included in the system of the invention.
Figure 4:
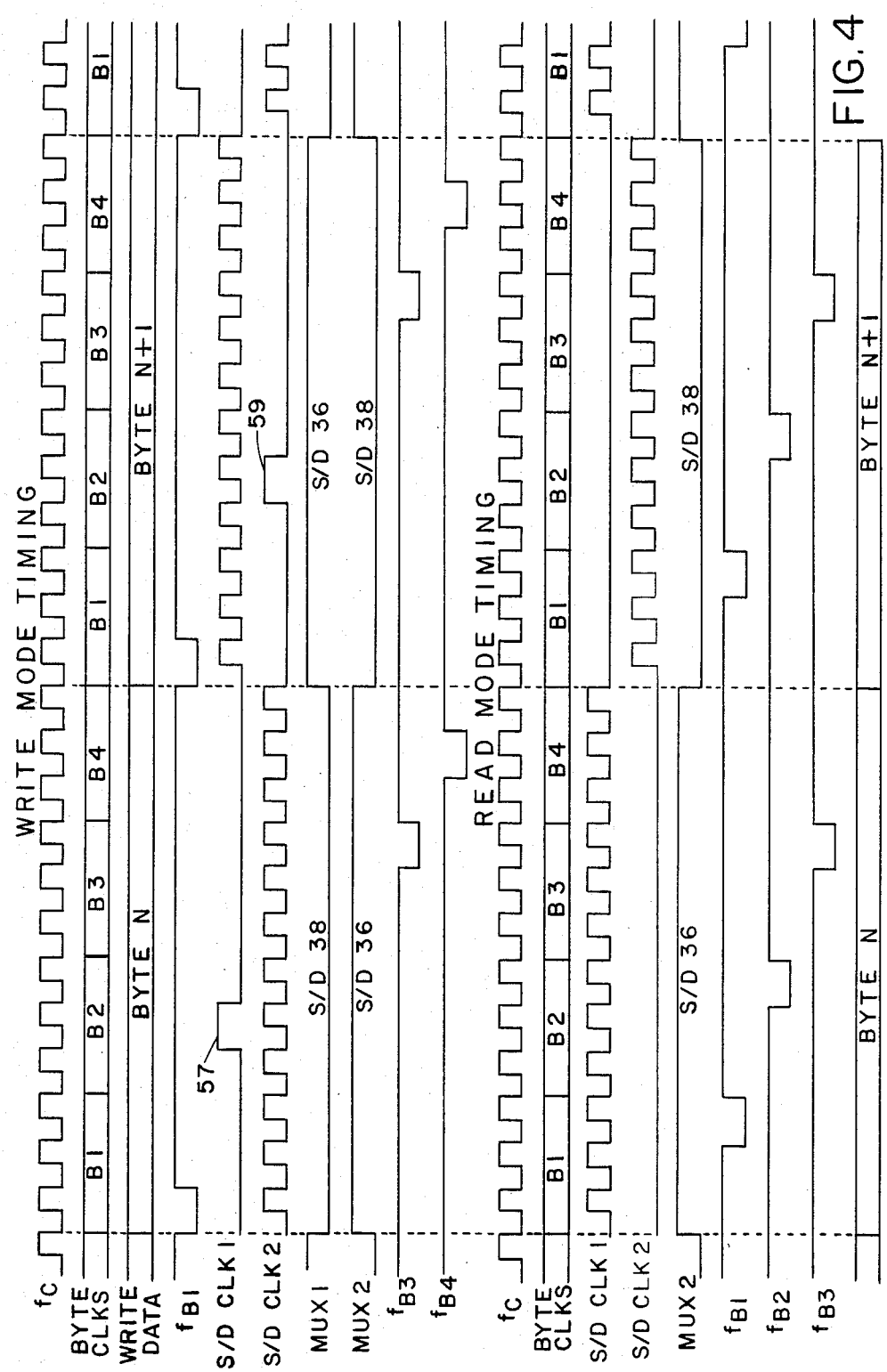
FIG. 4 is a waveform diagram illustrating read and write modes of operation of the system of the invention.

Referring now to FIGS. 3 and 4, the system 10 preferably operates in a conventional magnetic disk storage unit for encoding a parallel byte sequence of data to be written to a magnetic disk. The parallel byte stream is provided as write data from a data processing system (not shown) and is delivered unencoded to the system 10. The write data is converted by the system of the invention to an RLL (1,7)-encoded bit string comprising symbol channel write data which is submitted to disk drive electronics (not shown) for being entered on a magnetic disk (also not shown). This mode of operation is referred to hereinbelow as the WRITE mode and is signified by a WRITE state of the R/W signal produced by the control logic 12.

In a READ mode of operation (signified by a READ state of the R/W signal), an RLL (1,7)-encoded bit string comprising symbol channel read data obtained from the disk drive electronics for delivery to the data processing system is delivered to the system 10 for conversion to a decoded parallel byte sequence which is transferred by conventional means to the data processing system.

In the WRITE mode of operation, the byte-wide encoder and decoder system for RLL (1,7) code pictured in FIG. 3, a sequence of parallel bytes that are to be encoded for being written onto a magnetic disk are staged, byte-by-byte into the system through a first input latch 30, which is enabled by the WRITE state of the R/W signal. Once entered into the latch 30, a byte of unencoded data is available from the output of the latch 30 to a second latch 32 and to the RLL (1,7) byte-wide encoder 16. The encoder 16 is capable of accepting a byte (byte (N)) of unencoded data comprising eight parallel bits, $x_0$-$x_7$ ($x_0$=MSB), together with the least significant two bits, $x'_6$ and $x'_7$, of the preceding byte (byte (N−1)) and encoding byte (N) according to a known RLL (1,7) conversion algorithm having a coding rate of $\frac{2}{3}$.

As a result of the $\frac{2}{3}$ coding rate, encoding byte (N) results in the production by the encoder of a write symbol group (WSG (N)) of twelve encoded bits, $Y_0$-$Y_{11}$ ($Y_0$=MSB). In keeping with convention, each group of twelve encoded bits comprises 4 symbols, $Y_0$-$Y_3$ (where $Y_0$ is the most significant symbol), with each symbol defined by a respective set of three encoded bits. Thus, for example, symbol $Y_1$ is defined by encoded bits $Y_3$-$Y_5$.

The sequence of parallel bytes staged into the encoder 16 from the input latch 30 results in the provision by the encoder of a corresponding sequence of write symbol groups termed a write symbol group sequence (WSGS) that is fed simultaneously to a pair of conventional serializer/deserializers (S/D) 36 and 38 that constitute the S/D circuit 18.

Each of the S/D's 36 and 38 has a $P_i$ (parallel input) port and a $S_i$ (serial input) port. When the system of the invention is performing encoding to support write operations, alternating levels of the MUX 2 signal on the C (control) ports of the S/D's permit the entry of alternate write symbol groups provided by the encoder 16 through the $P_i$ ports of the S/D's. While either one of the S/D's 36 or 38 is receiving one write symbol group from the encoder 16, the other is converting the parallel format of the previous write symbol group by shifting the bits of the previous group serially through one of the 12 signal leads connected to the O (output) port of the S/D. The serialized symbol group is provided to a conventional 2-to-1 multiplexer 40, which is operated by the control logic 12 to interleave serialized symbol groups provided alternately from the S/D's 36 and 38 into a continuous symbol string of encoded bits. The encoded symbol string output by the multiplexer 40 is fed to conventional circuitry 42 which performs precompensation on the bits of the output symbol string to prepare them for being written as symbol channel write data onto the magnetic disk.

During a write operation, after entry of one write symbol group, say WSG (N), into a respective S/D through its $P_i$ port, but before serial shifting of the group to the multiplexer 40, write symbol group (N) is provided in parallel to another conventional 2-to-1 multiplexer 44 while the other S/D is serially shifting the previous write symbol group, WSG (N−1), serially to the multiplexer 40. Thus, the multiplexer 44 interleaves the symbol groups to reform the write symbol group sequence, which is provided, during write operations, through the output of the multiplexer 44 to a pair of conventional, serially-connected latches 46 and 48. As shown in FIG. 3, only the least significant ten bits of each symbol group are entered into the latches 46 and 48, while the most significant six bits of the currently-encoded symbol group are fed, together with the least significant ten bits of the previously-encoded symbol group, to the RLL byte-wide decoder 20.

As explained below, before WSG (N) is shifted serially through multiplexer 40, the decoder 20 receives the six encoded symbol bits of WSG (N) and uses them, together with the least significant ten bits of WSG (N−1) stored in the latch 48, to decode the byte (byte N−1) from which WSG (N−1) was encoded. The decoded byte (N−1) is provided by the decoder 20 to a conventional digital comparator 52 where it is compared with the unencoded form of byte (N−1) stored in the latch 32.

The output of the comparator 52 comprises a WRITE CHECK signal which, in one state, indicates correspondence between the decoded byte available from the decoder 20 and the stored byte available from the latch 32. The other state of the WRITE CHECK signal indicates noncorrespondence and can be used to institute standard error-correcting procedures in other components of the disk interface with which the system of the invention is used.

When data is to be obtained in encoded form from the magnetic disk and returned decoded to the data processing system, the control logic 12 changes the R/W signal to its READ state and the disk drive circuitry provides symbol channel read data obtained from the magnetic disk in the form of an input encoded symbol string. The input symbol string is fed through a shift register 54 to the $S_i$ ports of the S/D's 36 and 38. The S/D's are controlled to receive alternate groups of twelve encoded bits from the input string and to provide them, alternately in parallel form, through the multiplexer 44 to the decoder 50 in the manner described hereinabove. The alternate groups of parallel encoded bits are formed by the multiplexer 44 into a read symbol group sequence that is fed to the decoder 50 in the manner described hereinabove. The read symbol group sequence is decoded by the decoder 20 into an output sequence of parallel bytes that are returned to the data processing system through an output register 56 as read data.

Figure 5:
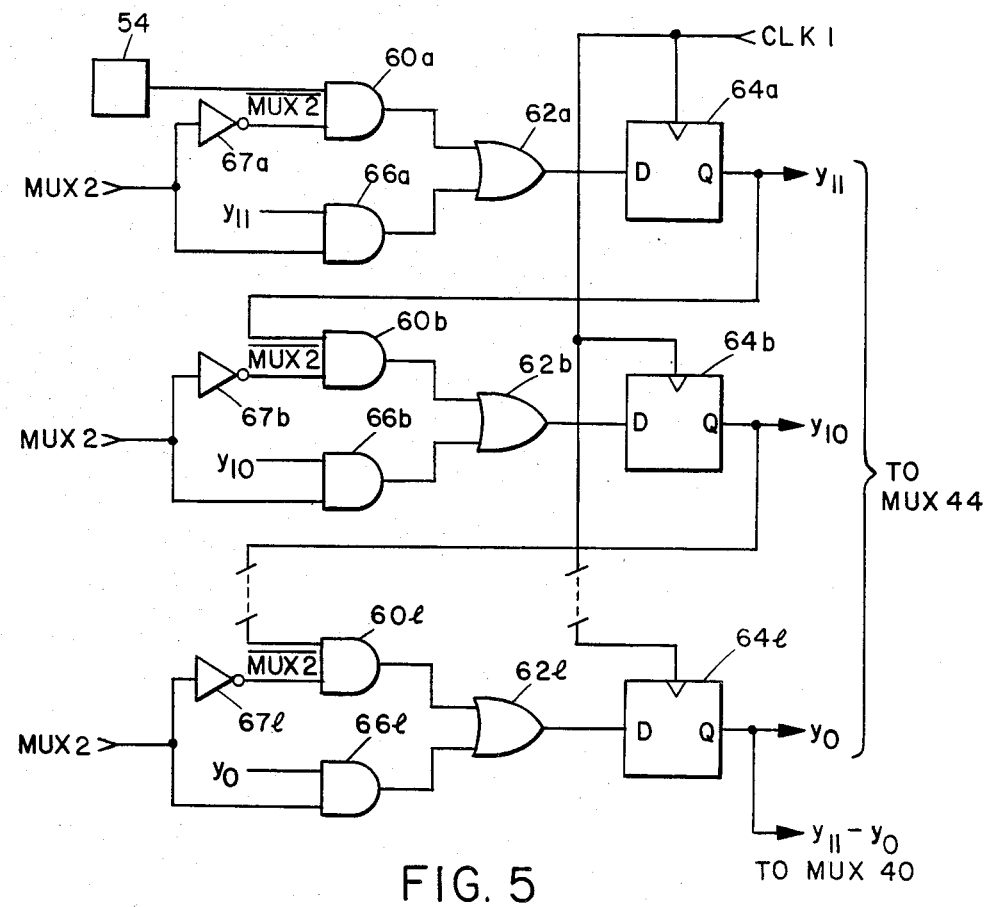
FIG. 5 is a schematic diagram illustrating a format converter used in the system of the invention.

The sequence of operations undertaken by the system 10 during write- and read-related operations can be understood now with reference to FIGS. 3–5. In FIG. 4, which shows the timing of the write and read operational sequences, the symbol string clock is labelled $f_C$. In addition, the BYTE CLKS signal represents a series of phased byte clock signals ($f_{B1}$-$f_{B4}$) that is cycled once for each byte of data encoded or decoded by the system 10. Since there is a $\frac{2}{3}$ ratio of unencoded to encoded bits, one byte clock cycle is completed for every twelve pulses of $f_C$, and each byte clock has the frequency $f_C/12$. Every twelve pulses of $f_C$ coincides with the completion of one encoding or decoding operation for each byte of data received or provided by the system 10.

In FIG. 4 all of the operative signals provided to the system 10 are produced conventionally by the control logic 12. Disk controllers having the ability to provide signals corresponding to those illustrated in FIG. 4 are well known in the art, the disk controller in the IBM disk storage system having the product number 3380 being one example.

The write mode begins with the provision of the WRITE state of the R/W signal to the system 10. The WRITE state of the R/W signal enables the operations of the latches 30 and 32, the multiplexer 40, the precompensation circuit 42, and the comparator 52. The signal is provided in inverted form to the shift register 54 and the output register 56 to prevent their operating during write mode operation. During write operations, the R/W signal gates $f_{B3}$ to the latch 46 and $f_{B4}$ to the latch 48. A write mode sequence of operation includes the provision of a parallel byte of data (byte (N)) to the latch 30, with the byte being latched on the negative level of $f_{B1}$ while present at the input of the latch. As soon as the byte is latched, it is present on the output of the latch 30 and encoded by the encoder 16. After encoding, the symbol group WSG (N) of 12 parallel encoded bits resulting from the encoding of byte (N) is loaded into S/D 36 by a gated write group load pulse 57 that occurs in CLK 1 during the write mode. The pulse 57 occurs during the second phase (B2) of the byte clock. In the next encoding cycle, twelve shift pulses are provided in CLK 1 to serially shift out the ISG entered by the pulse 57.

The positive state of the MUX 2 signal couples the parallel output of the S/D 36 to the output of the multiplexer 44 where, as explained above, the most significant six bits of write symbol group (N) are made available to the decoder 20. The decoder then decodes WSG (N−1). At the negative level of $f_{B3}$, the least significant ten bits of write symbol group (N) are entered into the latch 46. At this point, the previous symbol group, group (N−1), will have previously been shifted to the latch 48 from the latch 46. Simultaneously with the entry of the ten least significant bits of write symbol group (N) into the latch 46, the byte clock $f_{B3}$ sets the comparator 52 so that the decoded byte corresponding to symbol group (N−1) (that is, byte (N−1)) is compared against the unencoded version of byte (N−1) stored in the latch 32. Assuming that the unencoded and decoded bytes correspond, the control logic will, during the fourth phase B4 of the byte clock, produce $f_{B4}$. The fourth phase of the byte clock $f_{B4}$ enters byte (N) into the latch 32, and the ten least significant bits of symbol group (N) into the latch 48.

During the just-described encoding cycle for byte (N), twelve shift pulses of the gated clock signal CLK 2 will be provided by the controller 12 to S/D 38 to enable it to serially shift write symbol group (N−1) to the multiplexer 40. The negative state of the MUX 1 signal passes the serialized write symbol group (N−1) to the precompensation circuit 42.

Next, when byte (N+1) is available to be written to the magnetic disk, the just-described encoding cycle is performed again, with the exception that the roles of the S/D's 36 and 38 are reversed. That is, byte (N+1) is entered on $f_{B1}$ into the latch 30, and coded, causing the production of the write symbol group (N+1). The write symbol group (N+1) is entered in parallel into the S/D 38 by the provision thereto of gated write group load pulse 59 that occurs in CLK 2 during the write mode. Now, since the MUX 1 and MUX 2 polarities are reversed, write symbol group (N) is shifted from S/D 36 through the MUX 40 by the provision of twelve pulses of the CLK 1 signal to the S/D 36. It should be noted that the CLK 1 and CLK 2 signals are in phase with the MUX 1 and MUX 2 signals, which permits the multiplexer 40 to seamlessly interleave the serialized symbol groups. Further, the twelve shifting pulses of CLK 1 and CLK 2 when active have the frequency of $f_C$, and therefore ensure that the encoded bit string has the frequency $f_C$.

While write symbol group (N) is being serially shifted from the S/D 36, the negative state of the MUX 2 signal causes symbol group (N+1) to be provided through the multiplexer 44 and used in the decoding of symbol group (N). This permits a decoded version of byte (N) to be compared with the unencoded version stored in the latch 32.

Reference to FIG. 5 will provide an understanding of the operation of the serializer/deserializers 36 and 38. FIG. 5 illustrates the S/D 36 and includes an array of AND gates $60_a$–$60_l$ that feed through OR gates $62_a$–$62_l$ to the respective input D ports of clocked storage devices $64_a$–$64_l$. Similarly, AND gates $66_a$–$66_l$ are fed through the respective OR gates $62_a$–$62_l$ to the respective inputs of the storage devices $64_a$–$64_l$. Parallel entry of twelve bits of a write symbol group into the S/D 36 is permitted by the positive state of the MUX 2 signal which enables the gates $66_a$–$66_l$: when the CLK 1 load pulse 57 is fed simultaneously to the clock inputs of the storage devices $64_a$–$64_l$, the current write symbol group is entered into the S/D 36. To shift out the symbol group on the following encoding cycle, the MUX 2 signal changes state by going low. As illustrated, the low state of MUX 2 is inverted by the inverters $67_a$–$67_l$ to produce a conventional inverse logic signal $\overline{\text{MUX 2}}$ which enables AND gates $60_a$–$60_l$. With $\overline{\text{MUX 2}}$ high, the symbol group bits are fed sequentially through the S/D 36 from the storage device $64_a$ through the storage device $64_l$, with the serial output being available at the Q output port of device $64_l$.

It should be evident that the S/D 38 can be implemented in exactly the fashion illustrated for the S/D 36 in FIG. 5 simply by exchanging the MUX 2 and $\overline{\text{MUX 2}}$ signals, with the positive state of the MUX 2 signal provided to enable the gates $60_a$–$60_l$ and the inverted state, $\overline{\text{MUX 2}}$, enabling the gates $66_a$–$66_l$. Further, the clock signal input would be changed to CLK 2.

Read mode operations comprise a sequence of decoding cycles, each defined by one succession of the four phase byte clocks B1–B4. The READ state of the R/W signal disables latches 30 and 32, multiplexer 40, and comparator 52; it enables the registers 54 and 56. The WRITE state of the R/W signal gates $f_{B1}$ to the latch 46 and $f_{B3}$ to the latch 48.

In a read mode operation, the control logic 12 will have been alerted by the provision of a read request or command from the data processor to search for a standard pattern of encoded bits comprising a preamble in the data field to be read. As is conventional, when the addressed storage segment is initially read from the magnetic disk, the read data is shifted serially into the shift register 54 from the disk drive electronics. The contents of the shift register 54 are continuously read in parallel by the control logic 12 so that when the preamble denoting the beginning of the addressed storage sector is recognized, the control logic 12 can synchronize the provision of the gated clocks CLK 1 and CLK 2 to the S/D's 36 and 38. Thus, the first pulse of the twelve shift pulses of one of the gated clocks will be made available to one of the S/D's 36 or 38 in phase with the availability, at the serial output of the shift register 54, of the first encoded bit of the input bit string.

When the preamble is detected, the S/D's are driven out of phase to capture alternate groups of twelve serial bits from the input symbol string. While one S/D is receiving twelve encoded bits, the other is loading the previous twelve bits in parallel as an input symbol group (ISG) through the multiplexer 44 to the decoder 20. Thus, in FIG. 5, when MUX 2 is negative and CLK 1 is gated on, symbol bits are shifted serially from the register 54 into the devices $60_a$–$60_l$. After twelve shift pulses of CLK 1, twelve symbol bits will be held in S/D 36. Then, when MUX 2 rises, and CLK 2 is gated on, S/D 38 acquires the next twelve bits in the input symbol string.

Assuming now that input symbol group (N) has been entered into the S/D 36, a byte decode cycle will commence just after the rising edge of the first pulse of gated clock CLK 2. The twelve shift pulses of the gated clock and the positive state of the MUX 2 signal will shift the twelve encoded bits of input symbol group (N+1) into S/D 38. During the first byte clock phase B1 of the decoding cycle, the positive state of the MUX 2 signal permits input symbol group (N) to be available on the output of the multiplexer 44. This provides 6 most significant bits of symbol group (N) to be available to the decoder, thereby enabling the decoding of symbol group (N−1). During the first phase of the byte clock, the READ state of the R/W signal gates $f_{B1}$ to the latch 46, which enters the ten least significant bits of symbol group (N) into the latch 46. Next, $f_{B2}$ is provided to the output register 56 which clocks the decoded byte (N−1) into the register, thereby providing it in parallel-byte format as read data to the data processing system. Finally, the R/W signal gates $f_{B3}$ to the latch 48, transferring thereto the ten least significant bits of the input symbol group (N). During the next decode cycle in the read mode, input symbol group (N+1) is transferred in parallel from S/D 38 to be available through the multiplexer 44. This enables the decoder 50 to convert input symbol group (N) into output byte (N) with the sequence of operations described above for the previous decode cycle implemented for input symbol groups (N+1) and (N).

Figure 9:
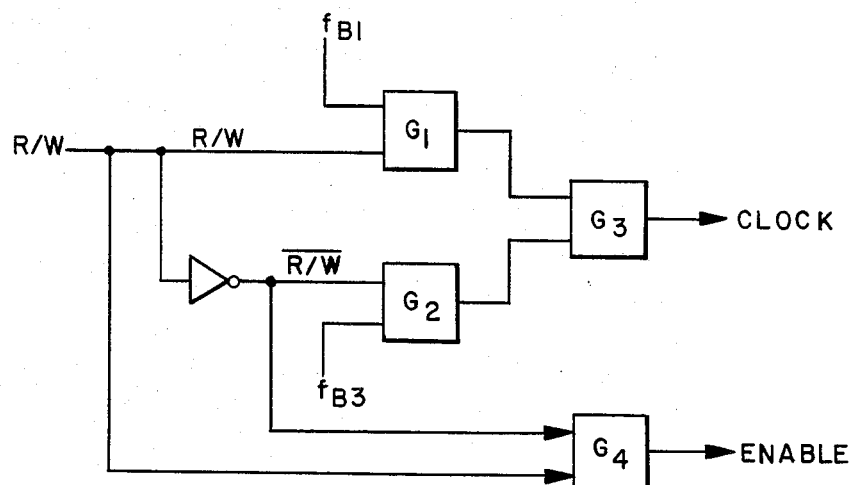
FIG. 9 is a gating circuit used to steer byte clock signals during WRITE and READ operations of the invention.

The use of the R/W signal to gate byte clocks to the registers 46 and 48 can be understood by reference to FIG. 9. In FIG. 9, one state of R/W permits $f_{B1}$ to pass through two gates (G1 and G3) to the clock input of, for example, register 46. The opposite state R/W permits $f_{B3}$ to pass to the clock input through gates G2 and G3. The gate G4 passes either R/W or $\overline{R}$/ to the enable port of the register.

Figure 6:
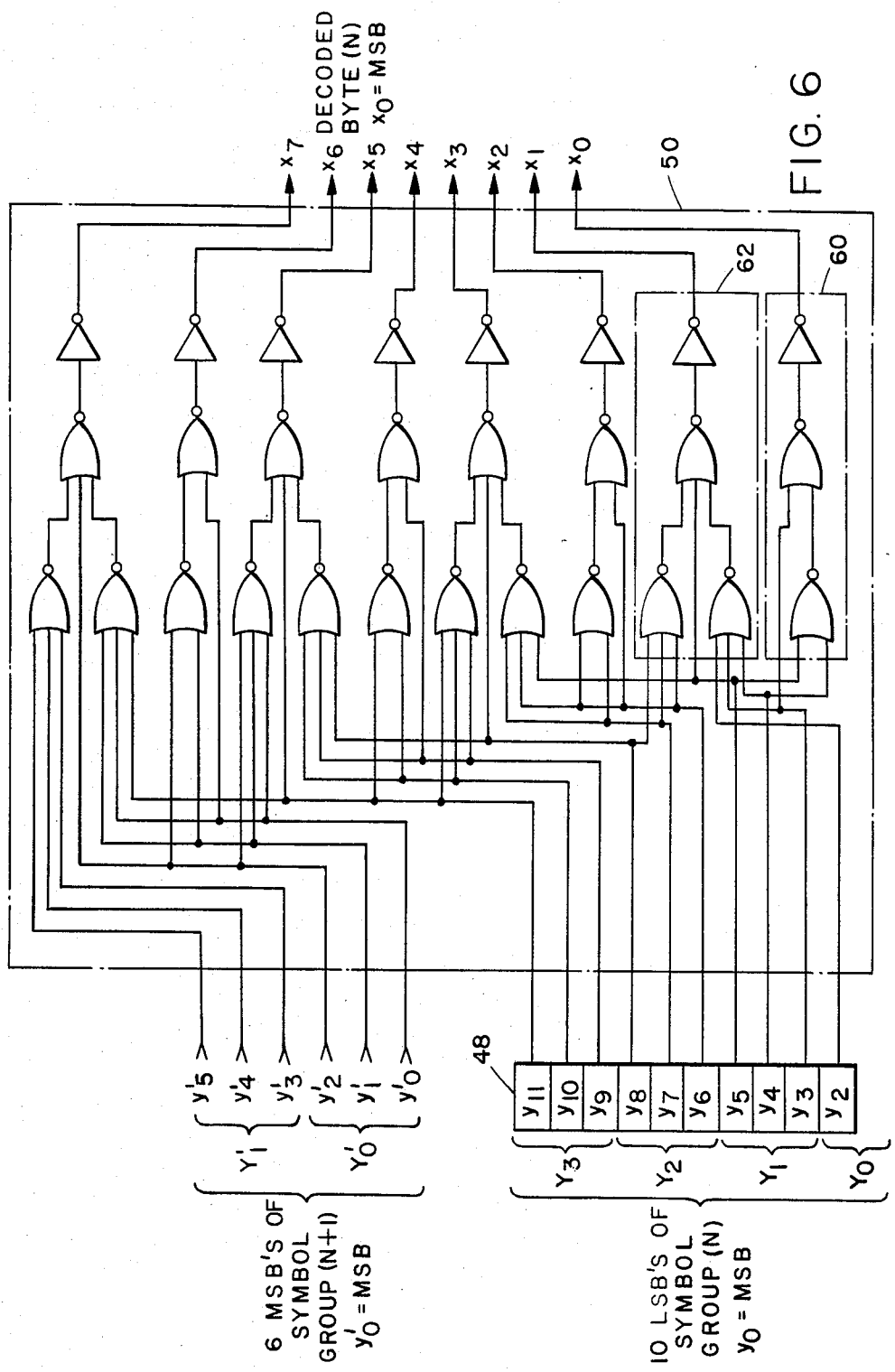
FIG. 6 is a schematic diagram illustrating a decoder for converting twelve bits of RLL (1,7)-encoded data simultaneously into a parallel byte of decoded data.
Figure 7:
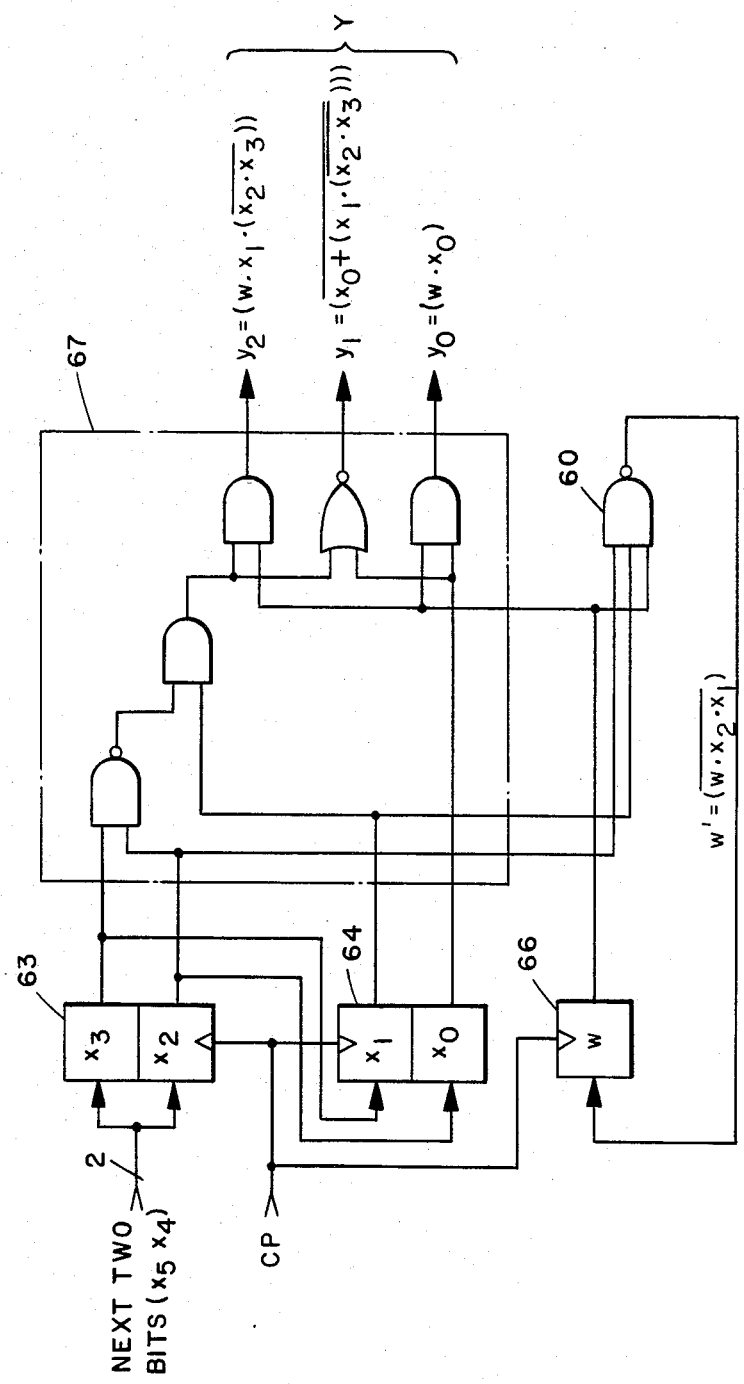
FIG. 7 is a circuit diagram of the encoder of the invention.
Figure 8:
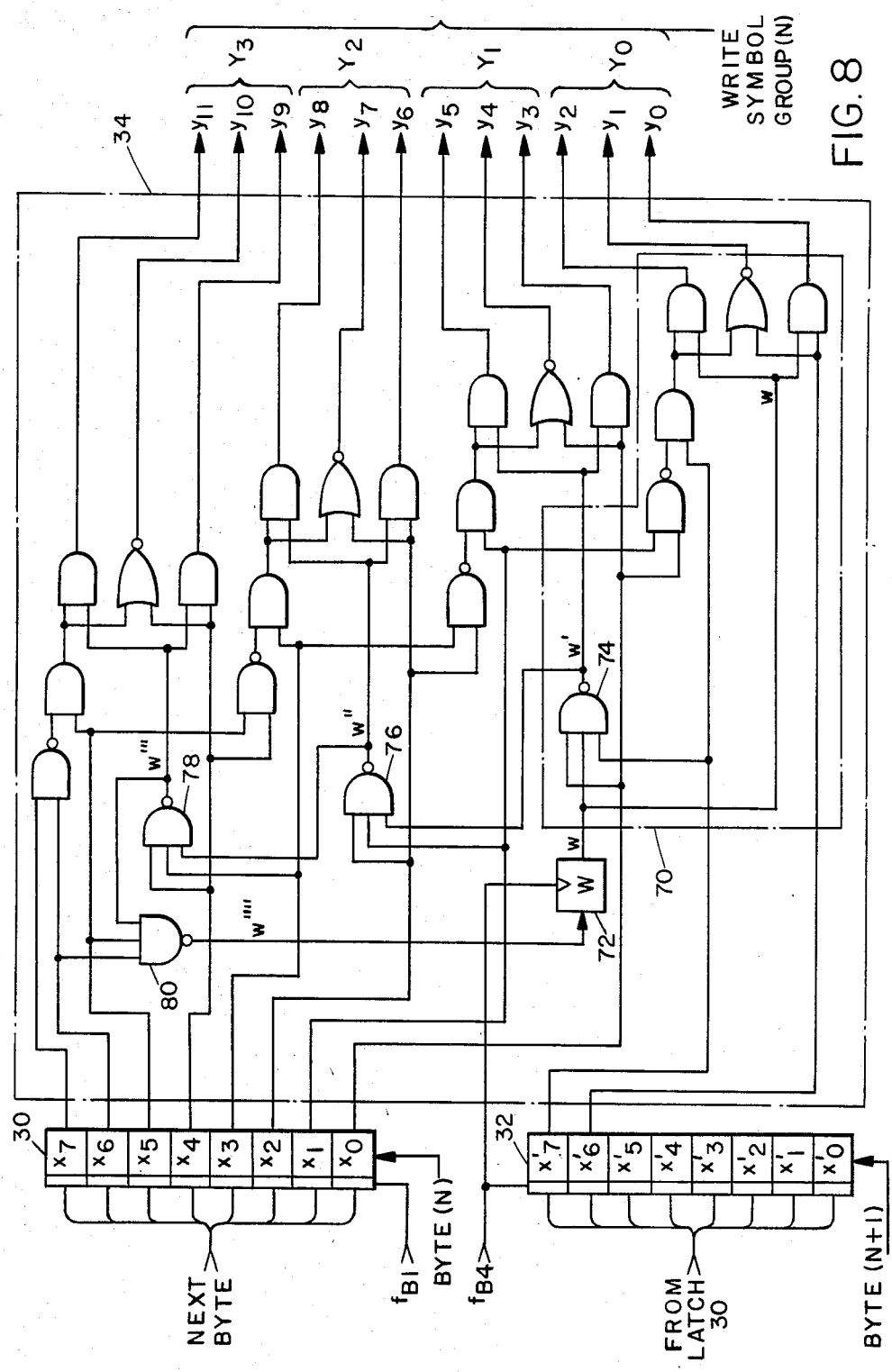
FIG. 8 is a circuit diagram of an encoder, including the encoder of the invention, used to simultaneously encode a byte of unencoded data into twelve bits of RLL (1,7)-encoded data.

With reference now to FIGS. 6–8, the structures and operations of the RLL byte-wide decoder 20 and the RLL byte-wide encoder 16 can be understood. In the discussion which follows, U.S. Pat. No. 4,413,251 to Adler et al and assigned to the assignee of this patent application, is incorporated herein by reference for the purpose of establishing the mathematical basis for the coding conversion operations of the decoder and the encoder. The tabular expression of an RLL (1,7) coding algorithm that encodes bit-by-bit at a $\frac{2}{3}$ rate is found in Table IV of the incorporated patent. As taught in the incorporated patent, the hardware implementation for an RLL (1,7) decoder that obtains bits $x_n$ and $x_{n+1}$ from the three RLL symbols, $$Y_n = (Y_n, Y_{n+1}, Y_{n+2})$$

$$Y_{n+1} = (Y_{n+3}, Y_{n+4}, Y_{n+5})$$

$$Y_{n+2} = (Y_{n+6}, Y_{n+7}, Y_{n+8})$$

is derived from the following Boolean expressions, which are converted to their NOR expression equivalents:

$$x_n = \overline{(y_{n+3} + \overline{(y_{n+4} + y_{n+5})})} \quad (1)$$

$$= \overline{(y_{n+3} + \overline{(y_{n+4} + y_{n+5})})}$$

$$x_{n+1} = \overline{((y_{n+2} + y_{n+3} + y_{n+4}) \cdot \overline{y_{n+5}} \cdot (y_{n+6} + y_{n+7} + y_{n+8}))} \quad (2)$$

$$= \overline{(\overline{(y_{n+2} + y_{n+3} + y_{n+4})} + y_{n+5} + \overline{(y_{n+6} + y_{n+7} + y_{n+8})})}$$

The NOR expressions (1) and (2) are implemented by the decoder NOR gate sections 60 and 62, respectively, in FIG. 6. It should be evident that the pair of NOR sections 60 and 62 can be replicated four times to provide simultaneous decoding of a byte (eight decoded bits) from sixteen encoded bits spanning 6 adjacent symbols, $Y'_0$–$Y'_1$, thus providing a look ahead to the two future channel symbols $Y'_0$ and $Y'_1$. In FIG. 6 the sixteen encoded bits are provided from the ten least significant bits of symbol group (N) stored in the latch 48 and the six most significant bits of symbol group (N+1) that are available to the decoder from the output of the multiplexer 44.

The byte-wide encoder might also be implemented by replicating the encoder taught in the incorporated Adler et al. patent four times to produce twelve encoded bits (4 symbols) at a time. However, as is known, the encoder in the incorporated patent relies upon the generation and storage of an intermediate 3-bit state for producing each coded symbol. Replication of circuitry for generating and storing the intermediate 3-bit states would result in a complicated and relatively slow-operating encoder. The encoder of FIG. 7 avoids concatenation of 3-bit state circuitry by enlarging the dependence of each encoded bit from two to four bits of unencoded data. This permits the realization of an RLL (1,7) encoder that provides simultaneous encoding of a parallel byte of data in which each resulting symbol is dependent upon only one state bit (in addition to four unencoded bits) for each encoding operation.

To understand the operation of the encoders of FIGS. 7 and 8, consider any current symbol Y that comprises three encoded symbol bits ($Y_0$, $Y_1$, $Y_2$) and that is encoded according to the algorithm of the Adler et al. patent from unencoded bits $x_0$ and $x_1$ contained in the bit string fragment . . . $x_0 x_1 x_2 x_3$. . .

According to the encoding algorithm of the Adler et al. patent the current symbol Y has the functional dependence given in equation (3):

$$Y = f(z_1, z_2, z_3, x_0, x_1) \quad (3)$$

where $z_1$, $z_2$, and $z_3$ are current state bits resulting from the encoding of the symbol immediately preceding Y, and $x_0$ and $x_1$ are the two unencoded bits to be used in encoding Y.

For the prior art encoder, the Boolean expressions defining the coded bits forming the symbol Y are given by equations (4)–(6) below.

$$y_0 = (\overline{z_1} \cdot z_2) \quad (4)$$

$$y_1 = \overline{((z_1 + z_2 + z_3) \cdot \overline{(x_0 \cdot x_1)})} \quad (5)$$

$$y_2 = (z_3 \cdot \overline{(x_0 \cdot x_1)}) \quad (6)$$

As is known, while the symbol Y is being encoded, the state variables ($z'_1$, $z'_2$, and $z'_3$) for the next symbol to be encoded (Y') are, in the prior art encoder, determined by equations (7)-(9).

$$z'_1 = (x_0 \cdot z_3) \qquad (7)$$

$$z'_2 = (x_0 \cdot \overline{z_3}) \qquad (8)$$

$$z'_3 = (x_1 \cdot \overline{(x_0 \cdot z_3)}) \qquad (9)$$

Finally, expressions for the next symbol $Y'=(y'_2, y'_1, y'_0)$ following Y may be obtained from equations (4)-(6) by substituting equations (7)-(9) for $z_1$, $z_2$, and $z_3$, respectively, and by substituting the two unencoded bits $x_2$ and $x_3$ for the bits $x_0$ and $x_1$. The next symbol expressions are given by the reduced Boolean equations (10)-(12).

$$y'_0 = \overline{(\overline{z'_1} \cdot z'_2)} \qquad (10)$$

$$= \overline{(\overline{(x_0 \cdot z_3)} \cdot x_0)}$$

$$y'_1 = \overline{((z'_1 + z'_2 + z'_3) \cdot \overline{(x_2 \cdot x_3)})} \qquad (11)$$

$$= \overline{((x_0 + x_1) \cdot \overline{(x_2 \cdot x_3)})}$$

$$y'_2 = (z'_3 \cdot \overline{(x_2 \cdot x_3)}) \qquad (12)$$

$$= (x_1 \cdot \overline{(x_0 \cdot z_3)} \cdot \overline{(x_2 \cdot x_3)})$$

The inventors have noted that, in the next state expressions (7)-(9) and in the next symbol equations (10) and (12), a $z_3$ variable always appears with $x_0$ in the form $\overline{x_0 \cdot z_3}$. They have defined a new state variable w that is given by equation (13).

$$w = \overline{(x_0 \cdot z_3)} \qquad (13)$$

This permits the further reduction of equations (10)-(12) to the equations (14)-(16) given below.

$$y'_0 = (w \cdot x_0) \qquad (14)$$

$$y'_1 = \overline{(x_0 + (x_1 \cdot \overline{(x_2 \cdot x_3)}))} \qquad (15)$$

$$y'_2 = (w \cdot x_1 \cdot \overline{(x_2 \cdot x_3)}) \qquad (16)$$

Finally, the next state variable w' for encoding the following symbol is given by equation (17).

$$w' = \overline{(x_2 \cdot z'_3)} = \overline{(x_2 \cdot x_1 \cdot w)} \qquad (17)$$

The set of equations (14)-(17) define an encoding operation that produces an RLL (1,7) symbol Y' based upon four unconstrained, unencoded bits $x_3$-$x_o$ and a single state variable w.

In FIG. 7, there is illustrated an encoder that implements the encoding equations (14)-(16) and the next-state equation (17). As is evident, the encoder has a pair of conventional 2-bit storage devices 63 and 64, with the outputs of the device 63 constituting the inputs to the device 64. Both devices 63 and 64 respond to the same level of a conventional clock pulse CP. Another conventional storage device 66 responds to the same level of the clock pulse CP as the devices 63 and 64. The outputs of the storage devices 63, 64, and 66 are all provided to a logic circuit 67 that implements the reduced output equations (14)-(16). In addition, selected outputs of storage devices 63 and 64, together with the output of the storage device 66, are fed as shown to the NAND gate 68 to implement equation (17).

In operation, unencoded data bits from an unconstrained data string are staged, two at a time, into storage devices 63 and 64. Thus, in the data string fragment . . . $x_0 x_1 x_2 x_3 x_4 x_5$. . . , the bits $x_0$ and $x_1$ are first entered into the storage device 63. On the succeeding clock level, the bits $x_0$ and $x_1$ are staged from the storage device 63 to the storage device 64 at the same time that the bits $x_2$ and $x_3$ are entered into the storage device 63. When the bits $x_0$-$x_3$ are contained in the storage devices 63 and 64, the four bits, together with the state bit w (which resulted from encoding with the two bits preceding $x_0$ and $x_1$), which is output by the storage device 66 cause the logic circuit 67 to produce the symbol Y consisting of the encoded bits $y_0$-$y_2$ according to equations (14)-(16), respectively. In addition, the two bits $x_1$ and $x_2$ from the unconstrained data string are fed, together with the current state bit w to the NAND gate 68 which combines them according to equation (17) to produce the next state bit w' to be used in the succeeding encoding operation. The succeeding encoding operation occurs on the next level of the clock pulse that enters $x_2$ and $x_3$ into the storage device 64, the next two bits $x_4$ and $x_5$ into the storage device 63, and the next state bit w' into the storage device 66.

One particulary attractive feature of the encoder of FIG. 7 is that any number of the basic logic implementing portion of the encoder, that is the logic section 67 and the NAND gate 68, can be cascaded in parallel to permit the simultaneous encoding of a data string fragment of any size into a corresponding number of symbols. The storage requirements for the cascaded sections would consist of a single storage device to receive a next state bit from the logic section encoding the least significant symbol and storage sufficient to receive to data string fragment to be encoded plus the least significant two bits of the preceding data strong fragment.

For example, a byte-wide encoder is illustrated in FIG. 8, where the portion of the byte-wide encoder 16 (introduced above) that is enclosed by the dotted line indicated by the reference numeral 70 implements, in a modular logic circuit, the logic-implementing portion of the circuit of FIG. 7. A conventional 1-bit data storage device 72 provides the current state variable w to the modular circuit 70. As shown in FIG. 8, the unencoded bits $x'_0$-$x'_7$ constitute a byte (N−1) stored in latch 32. The unencoded bits $x_0$-$x_7$ constitute the byte (N) following the byte (N−1) and are stored in latch 30. The bits $x_0$-$x_2$ are provided both to the encoder 16 and to the input of the latch 32. As required by equations (14)-(16), the adjacent bits $x'_6$ $x'_7$ $x_0$ $x_1$ are provided, together with w, to the modular circuit 70, which performs the encoding operation resulting in encoded bits $y_0$, $y_1$, and $y_2$ that form the (most significant) symbol $y_0$ of the write symbol group WSG (N).

To encode the less significant symbols $Y_1$-$Y_3$ of WSG (N), state variables w', w'', and w''' are produced by NAND gates 74-78, each of which implements the state variable equation (17). Each of the state variables produced by the NAND gates 74–78 are combined in a respective modular circuit equivalent to the modular circuit 70 with the proper bits in byte (N) to produce the remaining symbols, $Y_1$, $Y_2$, and $Y_3$ of WSG (N).

A next state variable $w''''$ is produced by the NAND gate 80 and provided as an input to the storage device 72 into which it is entered during a write mode encoding cycle by the occurrence of $f_{B4}$. Thus, when byte (N) is entered into the latch 32 and byte (N+1) into the latch 30, to prepare for the next write encoding cycle, the state variable $w''''$ will comprise the current state variable w that enables the encoding operation producing WSG (N+1).

It is to be understood that the particular embodiment of the invention herein described and shown in the drawings is merely illustrative and not restrictive of the fundamental invention. Therefore, various changes in the design structure and arrangement of the encoder of the invention may be made without departure from the spirit of the broader aspects of the invention as defined in the appended claims.

We claim:

1. In an encoder responsive to a data string including an unconstrained sequence of unencoded bits for producing a corresponding string of run-length-limited (RLL) (1,7) symbols at a ⅔ coding rate, the improvement comprising:
   means for receiving two sequential unencoded bits ($x_2$ and $x_3$) from said data string and for storing two sequential bits ($x_0$ and $x_1$) immediately preceding said two received bits in said data string;
   means for receiving a single state bit (w) derived from encoding a first sequence of four unconstrained bits that includes $x_0$ and $x_1$;
   gate array means, responsive to $x_0$, $x_1$, $x_2$, and $x_3$ and to w for producing an RLL (1,7) encoded symbol (Y), including three encoded bits, $y_0$, $y_1$, and $y_2$, at least one of said encoded bits being produced independently of w, and further for producing a next state bit (w') for use in encoding a second sequence of unconstrained bits including $x_2$ and $x_3$ subsequent to said production of said encoded symbol.

2. The encoder of claim 1 wherein said gate array means produces Y and w' according to the following Boolean expressions:

$$y_2 = (w \cdot x_1 \cdot \overline{(x_2 \cdot x_3)})$$

$$y_1 = \overline{(x_0 + (x_1 \cdot \overline{(x_2 \cdot x_3)}))}$$

$$y_0 = (w \cdot x_0)$$

$$w' = \overline{(w \cdot x_1 \cdot x_2)}$$

3. An encoder responsive to a sequence of parallel bytes for producing, at a ⅔ coding rate, a corresponding sequence of parallel RLL (1,7) symbols, comprising:
   latch means for receiving, in parallel format, one of said consecutive bytes and two bits from the byte preceding said received byte;
   register means for storing a single state bit derived from encoding said preceding byte; and
   gate array means connected to said latch and register means for producing, in response to said received byte, said two bits, and said single stored state bit, an RLL (1,7) encoded symbol group including 12 symbol bits and a single next state bit for use in encoding the next succeeding byte.

4. The apparatus of claim 3 wherein said gate array means includes a plurality of cascaded, simultaneously-operating encoding modules, each of said modules producing an RLL (1,7) symbol based upon 4 consecutive unencoded bits in said consecutive bytes.

5. An encoder responsive to a sequence of parallel bytes for producing, at a ⅔ coding rate, a corresponding sequence of parallel RLL (1,7) symbols, comprising:
   latch means for receiving, in parallel format, one of said consecutive bytes and two bits from the byte preceding said received byte;
   register means for receiving a single state bit derived from encoding said preceding byte; and
   gate array means connected to said latch and register means for generating a plurality of RLL (1,7)-encoded bits in response to said byte and said state bit in which at least one encoded bit is generated independently of said state bit, and further for producing a next state bit for use in generating another RLL (1,7) encoded symbol.

* * * * *